United States Patent [19]
Yonehara

[11] Patent Number: 5,342,792
[45] Date of Patent: Aug. 30, 1994

[54] METHOD OF MANUFACTURING SEMICONDUCTOR MEMORY ELEMENT

[75] Inventor: Takao Yonehara, Atsugi, Japan

[73] Assignee: Canon Kabushiki Kaisha, Tokyo, Japan

[21] Appl. No.: 936,738

[22] Filed: Aug. 31, 1992

Related U.S. Application Data

[63] Continuation of Ser. No. 713,608, Jun. 11, 1991, abandoned, which is a continuation of Ser. No. 581,086, Sep. 12, 1990, abandoned, which is a continuation of Ser. No. 153,551, Feb. 4, 1988, abandoned, which is a continuation of Ser. No. 21,746, Mar. 4, 1987, abandoned.

[30] Foreign Application Priority Data

Mar. 7, 1986 [JP] Japan .................... 61-48680

[51] Int. Cl.$^5$ .................... H01L 21/20; H01L 21/62
[52] U.S. Cl. .................... 437/24; 437/37; 437/38; 437/67; 437/919; 437/109; 437/233; 437/238
[58] Field of Search ........... 437/967, 109, 233, 238, 437/919, 67, 24, 90, 47, 52; 148/DIG. 109, DIG. 122

[56] References Cited

U.S. PATENT DOCUMENTS

| | | |
|---|---|---|
| 3,900,345 | 8/1975 | Lesk . |
| 4,327,476 | 5/1982 | Iwai et al. ............. 156/662 X |
| 4,353,086 | 10/1982 | Jaccodine et al. ............ 29/576 W |
| 4,454,646 | 6/1984 | Joy et al. ............. 29/576 W |
| 4,454,647 | 6/1984 | Joy et al. ............. 29/576 W |
| 4,473,598 | 9/1984 | Ephrath et al. ............ 427/126.4 |
| 4,502,913 | 3/1985 | Lechatom et al. ............ 29/576 W |
| 4,528,745 | 7/1985 | Muraoka et al. ............ 148/175 |
| 5,183,795 | 2/1993 | Ting et al. . |

FOREIGN PATENT DOCUMENTS

| | | |
|---|---|---|
| 0097789 | 1/1984 | European Pat. Off. . |
| 0145606 | 6/1985 | European Pat. Off. . |
| 0154871 | 9/1985 | European Pat. Off. . |
| 0177066 | 4/1986 | European Pat. Off. . |
| 0091518 | 6/1982 | Japan ............. 437/46 |
| 0159038 | 10/1982 | Japan ............. 29/576 W |
| 0211747 | 12/1982 | Japan ............. 29/576 W |
| 0119848 | 7/1984 | Japan ............. 29/576 W |
| 0154638 | 8/1985 | Japan ............. 29/576 W |
| 61-256626 | 11/1986 | Japan . |
| 62-54452 | 3/1987 | Japan . |
| 2185019 | 7/1990 | Japan . |
| 2277240 | 11/1990 | Japan . |
| 497519 | 3/1992 | Japan . |

OTHER PUBLICATIONS

Spielmann "Nitrogen Reactions on Silicon Wafers" IBM Technical Disclosure Bulletin, vol. 10, No. 3, Aug. 67, p. 333.

*Primary Examiner*—George Fourson
*Attorney, Agent, or Firm*—Fitzpatrick, Cella, Harper & Scinto

[57] ABSTRACT

A method of manufacturing a semiconductor memory element, comprising the steps of:
  forming a trench in a semiconductor substrate;
  forming an oxide film in a bottom and a side wall of the trench and a surface of the substrate;
  forming a selective deposition film on only the oxide film at the bottom of the trench, the selective deposition film being a member selected from the group consisting of a silicon film and a nitrogen-containing silicon film; and
  selectively growing polysilicon on only the selective deposition film, thereby forming a trench capacitor.

5 Claims, 1 Drawing Sheet

METHOD OF MANUFACTURING SEMICONDUCTOR MEMORY ELEMENT

This application is a continuation of application Ser. No. 07/713,608 filed Jun. 11, 1991, abandoned, which is a continuation of application Ser. No. 07/581,086 filed Sep. 12, 1990, now abandoned, which is a continuation of application Ser. No. 07/153,551 filed Feb. 4, 1988, now abandoned, which is a continuation of application Ser. No. 07/021,746 filed Mar. 4, 1987, now abandoned.

BACKGROUND OF THE INVENTION

1. Field of the Invention

The present invention relates to a method of manufacturing a semiconductor memory element utilizing a trench capacitor and, more particularly, to a method of easily forming a trench capacitor.

2. Related Background Art

The packing density of dynamic random access memories (DRAMs) and metal oxide semiconductor (MOS) memories has been increased year by year, and the age of 1-Mbit or 1-Gbit memories from 64- to 256-kbit memories is coming.

A conventional capacitive memory cell consists of a capacitor for storing signal charge and a MOS transistor for reading out the signal charge. In order to achieve a higher packing density, the capacitor occupying most of the cell area must be made compact because micropatterning of the MOS transistor poses limitations.

Various techniques have been proposed to reduce the size of the capacitor in the memory cell. If the size of the capacitor is simply reduced on a two-dimensional plane, the amount of signal charge is reduced. In order to compensate for this, the thickness of an insulating layer between the electrodes must be reduced or a material having a higher dielectric constant than that of $SiO_2$ must be used. A trench capacitor type memory cell is proposed to reduce the planar area of the capacitor without using the special material described above.

FIG. 1 is a schematic sectional view showing the basic structure of a conventional trench capacitor type memory cell.

Referring to FIG. 1, the memory cell consists of a trench capacitor for storing signal charge and a MOS transistor for reading out the signal charge from the trench capacitor. The trench capacitor is formed as follows:

A deep groove or trench 2 is formed in a silicon substrate 1 by reactive ion etching (RIE) or the like. An oxide film 3 is formed on the inner wall surface of the trench 2. Polysilicon is deposited to cover the entire surface including the trench 2. The polysilicon film is etched back until the surface of the substrate 1 is exposed. In this state, polysilicon 4 is left in only the trench 2. The substrate 1 opposes the polysilicon 4 through the oxide film 3, thereby constituting a trench capacitor.

It is difficult to detect an etching end timing in the etch-back process of polysilicon deposited on the substrate surface excluding the trench 2. Therefore, the fabrication process cannot be simplified or cannot be made easy.

SUMMARY OF THE INVENTION

It is an object of the present invention to solve the conventional problems described above.

It is another object of the present invention to provide a method of manufacturing a semiconductor memory element, comprising the steps of:
  forming a trench in a semiconductor substrate;
  forming an oxide film in a bottom and a side wall of the trench and a surface of the substrate;
  forming a silicon film or a nitrogen-containing silicon film on only the oxide film at the bottom of the trench; and
  selectively growing polysilicon on only the silicon film or the nitrogen-containing silicon film, thereby forming a trench capacitor.

DETAILED DESCRIPTION OF THE PREFERRED EMBODIMENT

A preferred embodiment of the present invention will be described with reference to the accompanying drawings.

FIGS. 2A to 2E are schematic sectional view for explaining the steps in manufacturing a semiconductor memory element according to the present invention.

Figure 1:
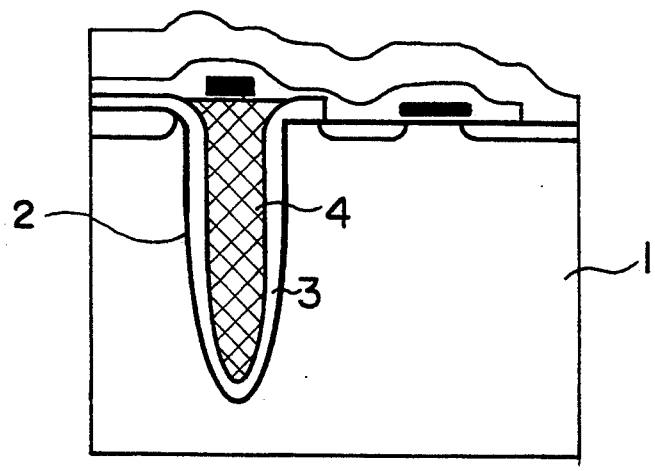
FIG. 1 is a schematic sectional view showing a basic structure of a conventional trench capacitor type memory cell.
Figures 2A, 2B, 2C:
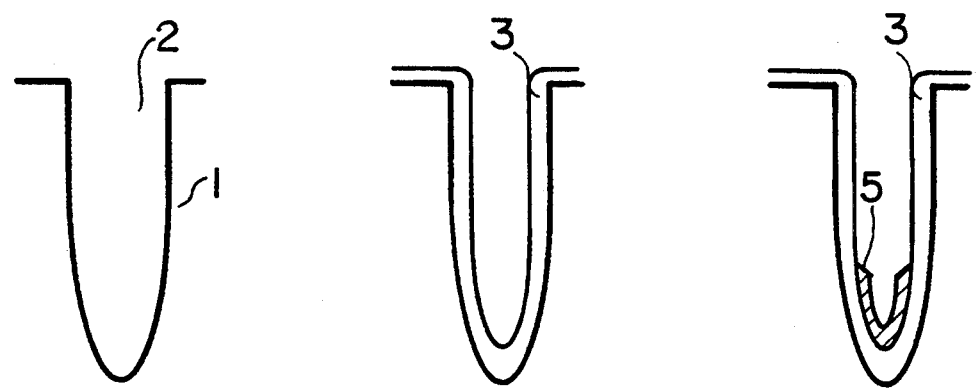
FIGS. 2A to 2E are schematic sectional views for explaining the steps in manufacturing a semiconductor memory cell according to the present invention.

As shown in FIGS. 2A and 2B, a trench 2 having a depth of several microns is formed in a silicon substrate 1 by reactive ion etching (RIE), and an oxide film 3 of $SiO_2$ or the like is formed on the inner wall surface of the trench 2 and the surface of the substrate 1.

Subsequently, a selective deposition film (e.g., a silicon nitride film) a polysilicon film or an amorphous silicon film) is formed on the surface of the oxide film 3 which corresponds to part of the inner wall surface of the trench 2 and the portion of the substrate surface. Formation of the selective deposition film is performed by low-pressure epitaxial growth, electron cyclotron resonance (ECR), or plasma or photo chemical vapor deposition (CVD). The selective deposition film is selectively etched by a lift-off method, reactive ion etching or the like to leave the film 5 at only the bottom of the trench 2, as shown in FIG. 2C.

The selective deposition film 5 may also be formed in the following manner. Using a resist pattern as a mask, silicon or nitrogen ions are implanted in the oxide film 3 at the bottom of the trench 2 at a low acceleration voltage to denature the surface of the oxide film 3 at the bottom of the trench, thereby forming a surface denatured layer. In this case, ion beam epitaxy (IBE) may be used to form a surface denatured layer without using a mask, thereby obtaining the selective deposition film 5.

Figures 2D, 2E:
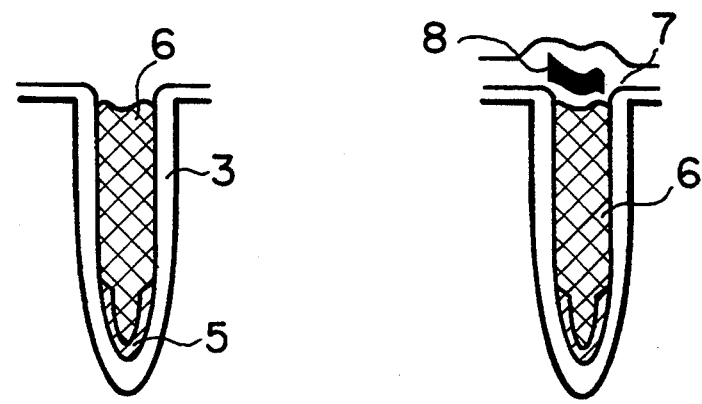

Polysilicon 6 is selectively deposited in the trench 2 by a CVD method having deposition conditions which allow deposition of polysilicon only in the trench (FIG. 2D). Subsequently, as shown in FIG. 2E, an oxide film 7 is formed. Finally, an electrode 8 is formed to prepare a trench capacitor.

Polysilicon 6 can be deposited on only the selective deposition film 5, but is not deposited on the oxide film 3 on the surface of the substrate 1. Therefore, unlike in the conventional method, the etch-back process can be omitted. The thickness of the polysilicon 6 can be arbitrarily determined by properly selecting a deposition rate. Selective deposition of polysilicon 6 in only the trench 2 will be described in detail below.

The substrate 1 having the silicon or silicon nitride deposition film 5, formed on the oxide film 3, at the bottom of the trench 2 is placed in a reaction chamber. The react ion chamber is evacuated at a predetermined vacuum. The substrate 1 is maintained at a predetermined temperature, e.g., 900° to 1,000° C. An $SiH_2CL_2$ gas, an $SiCl_4$ gas, an $SiH_4$ gas, or a mixture thereof is supplied as a source gas to the reaction chamber at a pressure substantially equal to the atomospheric pressure to selectively deposit the polysilicon 6 only on the selective deposition film 5. In this case, if a carrier gas such as HCl, $H_2$, or a mixture thereof is supplied to the reaction chamber, deposition efficiency and/or film quality can be improved. For example, when $SiH_2Cl_2$, HCl, and $H_2$ gases are used, optimal flow rates of these gases are preferably 0.1 to 1.0 l/min, 1.0 to 2.0 l/min, and 100 to 200 l/min, respectively. These values vary in association with other deposition conditions. Optimal conditions must be determined for each deposition cycle. An optical deposit ion rate is determined according to desired element characteristics and is preferably 0.03 to 0.08 $\mu m/min$.

An example of forming a semiconductor memory element utilizing a trench capacitor will be described. As shown in FIG. 2A, trenches 2 (only one trench is illustrated) each having a depth of 5 $\mu m$ and a width of 3 $\mu m$ were formed in a 6" silicon wafer (substrate) 1 by reactive ion etching. By using a film formation apparatus obtained by modifying a commercially available ECR CVD apparatus, an 1,000-Å thick $SiO_2$ oxide film 3 was formed on the inner wall surface of each trench 2 and the surface of the silicon substrate 1 by using $SiH_4$ and $N_2O$ gases (FIG. 2B).

Thereafter, a 500-Å thick $Si_3N_4$ selective deposition film 5 was selectively formed on the $SiO_2$ oxide film 3 at the bottom of the trench 2 by using $SiH_4$ and $NH_3$ gases. The substrate 1 was then heated to about 950° C. In this state, $SiH_2Cl_2$, HCl, and $H_2$ source and carrier gases respectively having flow rates of 0.5 l/min, 1.35 l/min, and 150 l/min were supplied to the apparatus at a pressure corresponding to the atmospheric pressure, so that polysilicon 6 was selectively deposited in only the trench 2 (FIG. 2D). According to element formation techniques known in the field of semiconductor fabrication, an $SiO_2$ insulating oxide film 7 and an Al electrode 8 were subsequently formed.

As described above in detail, a method of manufacturing a semiconductor memory element according to this embodiment can greatly simplify the fabrication steps and can eliminate the etch-back process by depositing polysilicon only on the silicon layer or the nitrogen-containing silicon layer formed at the bottom of the trench.

What is claimed is:

1. A method of manufacturing a semiconductor memory element, comprising the steps of:

forming a trench structure in a semiconductor substrate;

forming a continuous oxide film in a bottom and a side wall of the trench and a surface of the substrate;

forming a selective deposition film on only the oxide film at the bottom of the trench, wherein the selective deposition film comprises a surface denatured area obtained by implanting silicon ions in a surface of the oxide film at the bottom and selectively growing polysilicon on only the selective deposition film, thereby forming a trench capacitor.

2. A method of manufacturing a semiconductor memory element, comprising the steps of:

forming a trench structure in a semiconductor substrate;

forming a continuous oxide film in a bottom and a side wall of the trench and a surface of the substrate;

forming a selective deposition film on only the oxide film at the bottom of the trench, wherein the selective deposition film comprises a surface denatured area obtained by implanting nitrogen ions in a surface of the oxide film at the bottom and selectively growing polysilicon on only the selective deposition film, thereby forming a trench capacitor.

3. A method according to claim 1 or 2, wherein the selective deposition film has a tapered end portion.

4. A method according to claim 1 or 2, wherein the trench structure has a depth greater than a width thereof.

5. A method according to claim 1 or 2, wherein said semiconductor substrate comprises a silicon.

* * * * *

UNITED STATES PATENT AND TRADEMARK OFFICE
CERTIFICATE OF CORRECTION

PATENT NO. : 5,342,792
DATED : August 30, 1994
INVENTOR(S) : TAKAO YONEHARA

It is certified that error appears in the above-identified patent and that said Letters Patent is hereby corrected as shown below:

ON TITLE PAGE

In [56] References Cited, under FOREIGN PATENT DOCUMENTS:

```
"2185019    7/1990   Japan .
 2277240   11/1990   Japan .
  497519    3/1992   Japan ."     should read --2-185019   7/1990   Japan .
  2-277240  11/1990   Japan .
  4-97519    3/1992   Japan .--.
```

COLUMN 2

Line 27, "view" should read --views--.
Line 36, "film)" should read --film),--.

COLUMN 3

Line 6, "react ion" should read --reaction--.
Line 32, "an" should read --a--.

COLUMN 4

Line 17, "strate;" should read --strate; and--.

UNITED STATES PATENT AND TRADEMARK OFFICE
CERTIFICATE OF CORRECTION

PATENT NO. : 5,342,792
DATED : August 30, 1994
INVENTOR(S) : TAKAO YONEHARA

It is certified that error appears in the above-identified patent and that said Letters Patent is hereby corrected as shown below:

COLUMN 4

Line 31, "strate;" should read --strate; and--.

Signed and Sealed this

Thirty-first Day of January, 1995

Attest:

BRUCE LEHMAN

*Attesting Officer*     *Commissioner of Patents and Trademarks*